United States Patent [19]

Iwasa

[11] Patent Number: 4,734,156
[45] Date of Patent: Mar. 29, 1988

[54] METHOD FOR FORMING ELECTRICALLY CONDUCTIVE CIRCUITS ON A BASE BOARD

[75] Inventor: Yamahiro Iwasa, Hachiosi, Japan

[73] Assignee: Asahi Chemical Research Laboratory Co., Ltd., Tokyo, Japan

[21] Appl. No.: 895,716

[22] Filed: Aug. 12, 1986

[30] Foreign Application Priority Data

Sep. 29, 1985 [JP] Japan .................. 60-216041

[51] Int. Cl.$^4$ .......................... H01L 21/306
[52] U.S. Cl. ..................... 156/632; 156/666; 156/630; 156/637; 156/656; 156/901; 156/902; 427/98; 29/846; 428/901
[58] Field of Search ............... 156/901, 902, 630, 632, 156/634, 656, 668, 666; 428/901; 427/98; 29/846, 610 R; 338/308

[56] References Cited

U.S. PATENT DOCUMENTS

| | | | |
|---|---|---|---|
| 4,076,575 | 2/1978 | Chang | 156/901 |
| 4,353,816 | 10/1982 | Iwasa . | |
| 4,420,364 | 12/1983 | Nukii et al. | 156/901 |
| 4,525,383 | 6/1985 | Saito | 427/98 |
| 4,528,064 | 7/1985 | Ohsawa et al. | 156/902 |
| 4,639,285 | 1/1987 | Suzuki et al. | 156/902 |
| 4,661,372 | 4/1987 | Mance | 427/98 |

FOREIGN PATENT DOCUMENTS 2558367 8/1976 Fed. Rep. of Germany .
50-932 4/1980 Japan .

Primary Examiner—Kenneth M. Schor
Assistant Examiner—Lori-Ann Cody
Attorney, Agent, or Firm—Robert F. Ziems

[57] ABSTRACT

A method for forming electrically conductive circuits on a base board is described, the method comprising the steps of: forming a first electrically conductive circuit layer on one side of a base board, the first circuit layer being receptive to a metal plating; coating a plating-resistant resist on the same side of the base board excluding certain portions of the first circuit layer which are required to be electrically connected to another circuit layer to be subsequently formed on the first circuit layer; coating an electrically conductive copper paste being receptive to a metal plating on the same side of the base board in a manner as to electrically connect said portions of the first circuit layer, with the exception of certain regions of said portions of the first circuit layer which are to be subsequently processed with a metal plating; heating the base board to harden the same; cleansing the base board; and immersing the base board in a metal plating solution to form a metal plating on the electrically conductive copper paste and on said regions of said portions of the first circuit layer, to thereby form a second electrically conductive circuit layer on the first circuit layer.

7 Claims, 8 Drawing Figures

METHOD FOR FORMING ELECTRICALLY CONDUCTIVE CIRCUITS ON A BASE BOARD

BACKGROUND OF THE INVENTION

The invention relates to a method for forming electrically conductive circuits on a printed base board with use of copper lamination, and more particularly relates to a method for effectively using an electrically conductive copper paste to form at least two layers of electrically conductive circuits on one side of the base board, to thereby dispense with further processing the base board by forming through-holes therein which may otherwise be required by a conventional method, in which the base board has circuits formed on both sides thereof, so as to electrically connect the circuits to each other. Thus the invention may drastically reduce the production processes, the material required therefor and accordingly to production cost of the product. Moreover the invention may be utilized on a base board to be processed in the conventional method as mentioned above. In this case, the size of the finished product may be remarkably reduced, almost to less than a half of the conventional size.

It is generally known that the electrically conductive circuits formed on a printed base board by copper lamination are often required to be electrically connected. In the conventional method, this has been attained by forming etched copper lamination circuits on both sides of the print base board and then forming electrically conductive holes extended through the base board from one side to the other thereof to electrically connect the circuits on one side of the base board to the circuits on the opposite side of the base board. This conventional method, however, requires processing to provide a copper lamination on both sides of the base board, to etch the copper lamination and then to form a number of holes in the base board by means of a device such as the NC device, thus requiring high material and production costs.

In order to improve the mentioned conventional method, it is preferable to form the electrically conductive circuits in two lamination or layers on one face of the printed base board. In this case, however, it is required to use a specific electrically conductive copper paste having a proper electric conductivity and a proper metal plating capability. However the conventional electrically conductive copper paste is, in contrast to a precious metal such as silver, apt to be oxidized by a heat for hardening the copper paste. Such an oxidized paste will increase the electric resistance and lower the welding capability to the extent that the copper paste is practically useless. Further in order to plate the heated and hardened copper paste, it has been required to activate the surface of the paste by means of a catalyst so as to expose from the resin binder of the paste the copper grains as the nucleuses for plating on the surface of the paste.

The applicant has been for many years in engagement with a work for developing a new electrically conductive copper paste which may eliminate the defects and disadvantages as mentioned above, and has succeeded to realize such an electrically conductive copper paste to be actually used in this field or industry. In particular, these developments include the electrically conductive pastes ACP-020, ACP-030 and ACP-007P of Asahi Chemical Research Laboratory Co., Ltd., which respectively comprise a powdered copper, a synthetic resin and small amount of specific additive such as anthracene. The product ACP-020 includes a main element comprising 80% by weight of powdered copper and 20% by weight of synthetic resin, and is extremely excellent in electric conductivity but may be more or less inferior in the soldering property. The product ACP-030 includes a main element comprising 85% by weight of powdered copper and 15% by weight of synthetic resin, which is excellent in the soldering property but more or less inferior in electric conductivity. The product ACP-007P is an improvement of ACP-030 which is extremely receptive to a metal coating making it possible to apply a metal coating, for example, a chemical coating of copper on a hardened point-like film of this product without the need of using a catalyst.

It is therefore an object of the invention to provide a method for forming at least two laminations or layers of electrically conductive circuits which may be electrically connected to each other on one side of a base board, wherein the electrically conductive copper paste is coated on a part of a first copper circuit layer which is formed on one side of the base board and is to be electrically connected to a second copper circuit layer to be superposed on part of the first copper circuit layer, and then the electrically conductive copper paste is heated to be hardened, and then the hardened paste is chemically coated with a metal coating such as a copper coating so as to increase the electric conductivity of the electrically conductive copper paste up to that of the copper coating. Thus it becomes possible to provide at least two circuit layers on one side of a base board in contrast to the conventional base board having at least two circuit layers, one of which is provided on one side thereof and the other of which is provided on the other side thereof and electrically connected to each other by means of holes formed as extending through the base board. Further it becomes possible to eliminate the conventional processes for attaching the copper laminations on the base board and etching the laminations, to thereby drastically reduce the processing steps as well as the amount of material required for the processing steps approximately up to a half. Further it becomes possible to eliminate the conventional processing step for forming a hole or holes extended through the base board by means of the NC device which is considerably more expensive to purchase for that purpose, to thereby drastically simplify the processing of the base board, and to simultaneously reduce the cost of the completely processed base board approximately up to a half of the conventional one. It is another object of the invention to provide a multilayer print circuit board of a size reduced approximately up to a half of the conventional one by forming at least two circuit layers on both sides of a base board respectively which may be electrically connected by holes formed as extending through the base board. It is still another object of the invention to use an electrically conductive copper paste especially receptive to a metal plating so as to dispense with a processing step for activating the paste by means of a catalyst which is otherwise required before application of a metal plating process, thereby to additionally simplify the formation of a printed circuit board. It is still another object of the invention to form a multilayer printed circuit board having the first and second circuit layers provided on one side thereof which are respectively formed with the specific electrically conductive copper paste and a metal coating without the need of a copper laminating process and the etching process, to thereby considerably reduce the production process and the amount of material and accordingly the production cost.

In short, the present invention comprises the steps of: forming a first electrically conductive circuit as a first circuit layer on one side of a base board, the first circuit layer being receptive to a metal plating; coating a plating-resistant resist on the same side of the base board in a pattern excluding certain portions of the first circuit layer which are required to be electrically connected to another circuit layer to be subsequently formed on the first circuit layer; coating an electrically conductive copper paste to which a metal plating will adhere on the same side of the base board in a manner as to electrically connect said portions of the first circuit layer, however excluding certain regions of said portions of the first circuit layer which are to be subsequently processed with a metal plating; heating the base board to harden the same; cleansing the base board; and immersing the base board in a metal plating solution to form a metal plating on the electrically conductive copper paste and on said regions of said portions of the first circuit layer, to thereby form a second electrically conductive circuit lamination of said conductive copper paste and said metal plating on the first circuit layer.

Further the present invention comprises the steps of: attaching a copper layer on one side of a base board; etching the copper layer to form a first electrically conductive circuit layer; coating a plating-resistant resist on the same side of the base board excluding certain portions of the first circuit layer which are required to be electrically connected to another circuit layer to be subsequently formed on the first circuit layer; coating an electrically conductive copper paste receptive to a metal plating on the same side of the base board in a manner as to electrically connect said portions of the first circuit layer, with the exception of certain regions of said portions of the first circuit which are to be subsequently processed with a metal plating; heating the base board to harden the same; cleansing the base board; and immersing the base board in a metal plating solution to form a metal plating on the electrically conductive copper paste and on said regions of said portions of the first circuit layer, to thereby form a second electrically conductive circuit lamination of said conductive paste and said metal plating the first circuit layer, thus to provide at least two circuit layers electrically connected to each other on one side of the base board.

Further the present invention comprises the steps of: coating an electrically conductive copper paste being receptive to a metal plating on one side of a base board; heating the base board to harden the same; cleansing the base board; immersing the base board in a metal plating solution to form a metal plating on the electrically conductive copper paste, to thereby form a first electrically conductive circuit lamination of said conductive paste and said metal plating; coating a plating-resistant resist on the same side of the base board excluding certain portions of the first circuit lamination which are required to be electrically connected to another circuit lamination to be subsequently formed on the first circuit lamination; coating said electrically conductive copper paste on the same side of the base board in a manner as to electrically connect said portions of the first circuit lamination, with the exception of certain regions of said portions of the first circuit lamination which are to be subsequently processed with a metal plating; heating the base board to harden the same; cleansing the base board; and immersing the base board in a metal plating solution to form a metal plating on the electrically conductive copper paste and on said regions of said portions of the first circuit lamination, to thereby form a second electrically conductive circuit lamination of said conductive paste and said metal plating, thus to provide at least two circuit laminations electrically connected to each other on one side of the base board.

BRIEF DESCRIPTION OF THE DRAWINGS

FIGS. 1 through 5 show a first embodiment of the invention, in which:

FIG. 1 is a side elevational view of a base board shown in vertical section and having a copper layer attached on one side of the base board, which is etched to form a first electrically conductive circuit layer;

FIG. 2 is the same as the base board in FIG. 1, but has a plating-resistant resist coated on the same side thereof;

FIG. 3 is the same as the base board in FIG. 2, but has an electrically conductive copper paste coated on the same side thereof;

FIG. 4 is the same with the base board in FIG. 3, but has a metal plating formed on the same side thereof;

FIG. 5 is the same as the base board in FIG. 4, but has an overcoat painted on the same side thereof as the final step of the invention;

FIGS. 6 through 8 show a second embodiment of the invention, in which:

FIG. 6 is a side elevational view of a base board shown in vertical section and having an electrically conductive copper paste directly coated on one side thereof;

FIG. 7 is the same as the base board in FIG. 6, but has a metal plating formed on the same side thereof to form a first circuit lamination; and FIG. 8 is the same as the base board in FIG. 7, but has the series of steps processed on the same side thereof in the same manner as in the first embodiment.

DETAILED DESCRIPTION OF THE INVENTION

Figure 1:
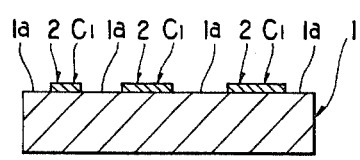

The invention will now be described in reference to FIGS. 1–5. As shown in FIG. 1, one or more electrically conductive circuit layer parts of a first circuit layer $C_1$ are formed on a printed base board 1 which is made of a polymer by way of example. The circuit layer $C_1$ is receptive to a metal plating such as a copper plating by way of example. The circuit layer $C_1$ is formed by etching a copper layer 2 attached to one side of the printed base board 1.

Figure 2:
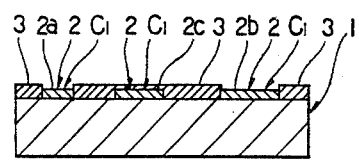
Figure 4:
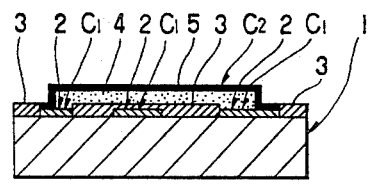

In the next place, as shown in FIG. 2, the printed base board 1 is coated with a plating-resistant resist 3 excluding the portions $2a, 2b$ of the circuit layer $C_1$ which are required to be electrically connected to an electrically conductive circuit layer $C_2$ of a circuit lamination to be subsequently formed as shown in FIG. 4, that is, the resist 3 is coated by way of printing on the portion 2C of the circuit layer $C_1$ which is not required to be electrically connected to the circuit layer $C_2$ and on the portions $1a$ of the base board 1 where there are no circuit parts of the first circuit layer $C_1$. By the way, the resist 3 may be the product CR-2001 provided by the applicant, Asahi Chemical Research Laboratory Co., Ltd.

Figure 3:
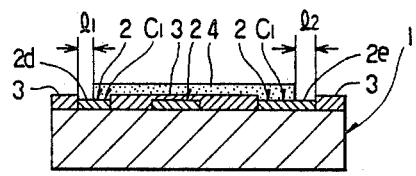

Then as shown in FIG. 3, an electrically conductive copper paste 4 is coated on the same side of the base board 1 by way of screen printing in a manner as to electrically connect the portions 2a,2b which have remained without the coating of the resist 3, with the exception of the regions 2d,2e of the widths $l_1$, $l_2$ respectively of the portions 2a,2b, so that a metal plating may be formed on the electrically conductive copper paste 4 and on the regions 2d,2e. The electrically conductive copper paste 4 is receptive to a metal plating and may be the product ACP-007P provided by the Applicant, Asahi Chemical Research Laboratory Co., Ltd. Then the base board so processed is heated for approximately 30 minutes at a temperature of about 150° C. so as to be hardened.

Then the hardened base board 1 is cleansed by acid pickling, that is, for example, an alkali reducing process is performed by a solution of 4-5% by weight of sodium hydroxide for several minutes, and then is cleansed by acid pickling by a solution of 5% by weight of hydrogen chloride for one minute.

Subsequently as shown in FIG. 4, the base board 1 so processed is immersed in a metal plating solution such as a copper plating solution (not shown) by way of example so as to chemically plate the surfaces of the regions 2d,2e of the circuit layer $C_1$ and of the electrically conductive copper paste 4. A coat having a thickness of approximately 1.0 μm-3.0 μm of the copper plating may be obtained using a solution temperature of 70° C., a pH of 12 and one hour of immersion, though the affect may be more or less varied in dependence upon the composition of the plating bath. However actually an immersion time of about 1.7-5 hours is required because a minimum coat thickness 5 μm is practically required. In this way, a copper plating lamination layer 5 is formed on the electrically conductive copper paste 4 and on the regions 2d,2e of the circuit layer $C_1$ as shown in FIG. 4. Thus the copper plating lamination layer 5 and the electrically conductive copper paste 4 constitute an electric circuit lamination $C_2$ on one side of the base board 1, the electric circuit lamination $C_2$ being electrically connected to the electric circuit layer $C_1$.

Figure 5:
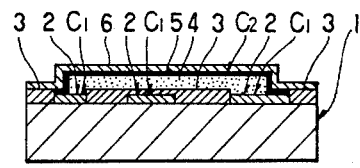

Finally as shown in FIG. 5, the side of the base board 1, where the electric circuit layer $C_1$ and circuit lamination $C_2$ are formed, is painted with an overcoat 6, which may be the product CR-2001 provided by the applicant, Asahi Chemical Research Laboratory Co., Ltd., by way of printing and then is dried. Thus the series of processing steps of the base board 1 are terminated to provide a finished base board.

Figure 6:
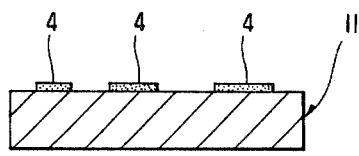
Figure 7:
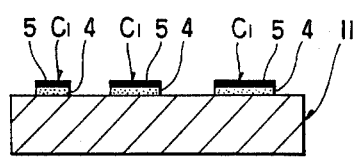
Figure 8:
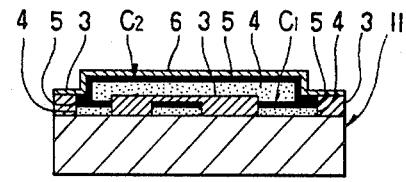

Now in reference to FIGS. 6 through 8 showing a second embodiment of the invention, a polymer base board 11 is directly painted by way of screen printing with the electrically conductive copper paste 4 which is receptive to a metal plating, instead of being processed with a copper layer 2 to be etched as mentioned in the first embodiment, and then is heated for 30 minutes at a temperature of about 150° C. so as to be hardened. Subsequently the base board 11 is cleansed by acid pickling and then is immersed in a metal plating solution such as a copper plating solution by way of example in the same manner as in the first embodiment so as to form the copper lamination layer 5 on the surface of the electrically conductive copper paste 4, to thereby form a first electric lamination $C_1$ as shown in FIG. 7.

The subsequent processing steps are same with those of the first embodiment. Namely as shown in FIG. 8, the resist 3 is coated on the same side of the base board 11 excluding the portions of the circuit lamination $C_1$ which are required to be electrically connected to a second circuit lamination $C_2$ to be subsequently formed. Then the electrically conductive copper paste 4, which is receptive to a metal plating, is coated on the same side of the base board 11 in the manner as to electrically connect the portions of the circuit lamination $C_1$ which have remained without the coating of the resist 3, with the exception of the certain regions of the portions of the circuit lamination $C_1$. Then the base board 11 is heated to be hardened. The base board 11 is then cleansed by acid pickling, and then is immersed in a copper plating solution to form a copper plating lamination layer 5 on the electrically conductive paste 4 and on the regions of the circuit lamination $C_1$. Thus the copper plating lamination layer 5 and the electrically conductive copper paste 4 form the second circuit lamination $C_2$. In this way, the circuit lamination $C_1$ and $C_2$ are formed on one side of the base board 11. Finally the overcoat 6 is painted by way of printing on the outer surface of the circuit lamination $C_2$ and the processing of the base board 11 is finished.

The mentioned first and second embodiments do not require through-holes to electrically connect the two circuit layers or circuit laminations. The invention, however, may be applied to the base board having the through-holes processed therein to electrically connect circuits on opposite sides of the base board. It is needless to say that more than two circuit laminations may be formed on one side of the base board, and that the metal plating is not limited to the copper plating. A silver plating may be employed in place of the copper plating. However it may be said that the copper plating is cheapest and is most adapted to the mass production of print circuit boards.

Now it will be necessary to precisely describe the property of the electrically conductive copper paste 4 which is receptive to a metal plating used in this invention:

In order that the electrically conductive coating of a copper powder mixed paste is to be usable, it is required that the film formed by the coating has an electric resistance of approximately $1 \times 10^{-2} - 1 \times 10^{-3}$ Ω-cm, and a resistance property against humidity, that is, a property of minimum deterioration in a lapse of time in an atmosphere of high humidity, and also a temperature property which may cope with the conventional electrically conductive coating of silver with respect to the resistance against the temperature lower as well as higher than the normal temperature 20° C.

On condition that the copper powder simply mixed with the phenol resin is painted, heated and dried, the copper powder is oxidized to form an oxidized copper due to the heating and comes to have an electric resistance of $1 \times 10^3$ Ω-cm or more.

Generally the electrically conductive mechanism of an electrically conductive coating is formed by a conducting path of a mutual contact between the metal powder grains contained in the coating. Since the metal powder grains, however, have the outer faces always covered by the oxidized substances which cause the coating to produce an extremely high resistance against electric current, it is generally known by those who are skilled in the art that such a coating is not suited for practical use. Silver is, however, something different because such a precious metal is not substantially accompanied by the oxidized substances, in effect giving no rise in electric resistance. The other metals such as the copper powder or other mediocre metals produce a film of oxidized substances at the outer faces of the powder grains thereof instantly in the air as well known. It is, therefore, necessary to reduce the electric resistance at the contacts between the copper powder grains of the power conductive coating. Namely it becomes necessary to remove the oxidized substances in the course of forming the electrically conductive film so as to form the conductive path by the face contacts of the metal atoms. For attaining this object, it becomes necessary to eliminate the oxidized substances on the copper powder grains by some means. In the next place, it becomes necessary, after the completion of the electrically conductive mechanism of normal copper powder without the oxidized substances, to prevent the copper powder from giving a high electric resistance again in the course of heating treatment or due to the influence of outer oxygen in the course of actual use.

Accordingly, the satisfaction of the above mentioned first and second requirements is a key to make the electrically conductive coating of the invention usable. Namely it is a most important to determine a specific additive and the amount thereof to be added to the mixture of copper powder and synthetic regin.

The inventor of this application has succeeded in determining the specific additive and the amount thereof through many studies and experiments over many years and succeeded in the development of a new electrically conductive copper paste which is to replace the conventional copper lamination and electrically conductive silver paste.

The invention has been made using electrically conductive copper pastes of copper powder ACP-020, ACP-030 and ACP-007P produced by Asahi Chemical Research Laboratory Co., Ltd.

As an additive, anthracene or the inducer thereof shows an excellent effect, especially anthracene ($C_{14}H_{10}$) and anthracene carbonylic acid ($C_{14}H_9COOH$) have shown the most excellent effect, and in the next place anthrazine ($C_{28}H_{16}N_2$) and anthranylic acid ($C_6H_4(NH_2)(COOH)$) have also shown the excellent effect. On the other hand, aminobenzoic acid ($C_6H_5.COOH$) is almost unpracticable because it shows the electric resistance value $1 \times 10^{-2}$ $\Omega$-cm which is larger than that of anthracene or the inducer thereof by one figure.

The electrically conductive copper paste 4 of the invention substantially comprises the mixture in a liquid condition of 70-85 weight percent of copper powder, 15-30 weight percent of at least one selected from the group of phenol resin, epoxy resin, polyester resin and xylene resin, and a slight amount, preferably 0.23-1.6 weight percent, but practically 0.2-5 weight percent, of anthracene or the inducer thereof anthranylic acid or anthrazine, as an additive.

During the heating treatment, the anthracene by way of example, as the annex agent of the invention, melts the compounds of oxidized copper and other attached around the copper powder into the material of a nature substantially same with the coexisting resin. This phenomenon increases the electric conductivity, and additionally the compound of the annex agent and copper melted with the resin is effective to reduce the penetration rate of water and oxygen through the resin. The anti-oxidization effect made by the anthracene or the inducer thereof, anthranylic acid or anthrazine to the copper powder is as follows:

For example, the anthracene carbonylic acid ($C_{14}H_9COOH$) reacts to the oxidized copper existing or formed around the copper powder in the chemical formula, $$CuO + 2C_{14}H_9COOH \rightarrow (C_{14}H_9COO)_2Cu + H_2O,$$

and produces the anthracene carbonylic acid cuprous salt. Due to the chemical reaction developed in the painted film which is protected from the outer atmosphere by the coexisting resin, the copper powder is deprived of the oxidized substances on the outer faces thereof and exposes the cleansed metal faces, which are arranged in contact to each other to form a desirable power conductive path of minimum electric resistance.

On the other hand, the anthracene carbonylic acid cuprous salt produced in the chemical reaction is melted into and evenly dispersed in the coexisting phenol resin, epoxy resin, polyester resin or xylene resin, and will not give adverse influence to the formation of screening film accompanied by the hardening reaction thereof with the contacted arrangement of the copper powder grains. Moreover, the copper compound of anthracene inducer properly mixed with the resin has an effect to lower the water and oxygen penetration rate of the resin and considerably increase the resistance against humidity and oxygen thereby to more highten the effect of the invention.

In this case, it is experimentally confirmed that the most effective amount of the additive to be added is in the range from 0.23 weight percent to 1.5 weight percent, but practically the range may be from 0.2 to 5 weight percent.

If the added amount of anthracene or the inducer thereof is varied to make a coating film of thickness 40μ, the electric resistance of the coating film is maintained almost constant at the value $1 \times 10^{-3}$ $\Omega$-cm indicating an extremely desirable effect, when the added amount of anthracene or the inducer thereof is about 0.23-1.5 weight percent. In case the added amount of the additive is 0.2 weight percent, the coating film shows an electric resistance of $1.3 \times 10^{-3}$ $\Omega$-cm, and also in case the added amount of the annex agent is 5 weight percent, the coating film shows an electric resistance of $2 \times 10^{-3}$ $\Omega$-cm. It is easily understood that these amounts of the additive are also within the permissible range of practical use of the coating. It is, however, seen that the coating shows a radical increase of electric resistance when the amount of the annex agent is less than 0.2 weight percent. Actually the coating shows the electric resistance $1 \times 10^{-2}$ $\Omega$-cm in case the amount of the additive is 0.1 weight percent, which is a value unsuitable for practical usage of the coating. Similarly in case the amount of the additive is more than 5 weight percent, the coating shows a radical increase of electric resistance, and actually shows an electric resistance of $1 \times 10^{-2}$ $\Omega$-cm when the amount of the additive is 8 weight percent, which is also a value unsuitable for practical use of the coating. The above mentioned effects of experiments are same with respect to the other additives such as anthranylic acid and anthrazine.

As the reason that the above mentioned critical values have been experimentally confirmed, the following mechanism is considered. Namely as is mentioned with respect to the function mechanism in the case of the anthracene carbonylic acid employed as the additive, a theory of chemical quantity is produced as a matter of course between the additive and the oxidized substances, in the course of reaction by the additive to the oxidized substances attached around the outer faces of copper powder grains melting and removing the oxidized substances from the copper powder. Therefore it is impossible to completely prevent the oxidization of copper powder during the treatment thereof in the air even if the copper powder is of a nature comparatively reluctant to oxidization. The fact that a minimum amount of additive (about 0.2 weight percent) shows that there is a minimum amount of oxidized substances in the mixture of copper powder and resin. Similarly the fact that a maximum amount of additive (about 5 weight percent) is found out from experiments shows that an exceeded amount of additive will give an adverse influence, for example, to deteriorate the property of the coexisting resin, lowering the power conductivity of the coating.

According to the above mentioned structure of the electrically conductive copper paste, the electric property, for example in the case of the film thickness 40 $\mu$m of the printed circuit, can be indicated as $1 \times 10^{-3}$ $\Omega$-cm by an electric resistance value which is a surprising effect showing about 1/1,000,000 of the resistance value in contrast to the coating without any additive being employed. As to the resistance property against humidity, the electric resistance increases slightly, but is maintained unchanged after about 504 hours. Subsequently no change or deterioration is seen in the lapse of time.

As to the resistance property against temperature, the electric resistance changing rate is extremely excellent and about ½ of that of the power conducting coating of silver in a condition below the normal temperature, and is almost the same with that of the latter in a condition about the normal temperature. The coating of the invention can cope with the coating of silver at the conventional temperature of about 60° C.

The electrically conductive copper paste 4 of the present invention, which is the product ACP-007P provided by the applicant, is an improvement of the mentioned electrically conductive paste ACP-030 which is receptive to soldering, and is very easy to provide the copper powder grains exposed on the surface thereof which are to be the nucleuses in the chemical plating. Namely the copper grains deposed from the copper plating solution may be easily attached to the exposed copper powder grains of the paste. It is therefore easy to form the copper plating on the electrically conductive paste only after a simple cleansing process as mentioned, instead of first performing an activating process on the paste by way of a catalyst as is required by conventional processes.

What is claimed is:

1. A method for forming electrically conductive circuits on a base board comprising the steps of:
   (a) forming a first electrically conductive circuit layer on one side of the base board, the first circuit layer being receptive to metal plating;
   (b) coating a plating-resistant resist of the same side of the base board in a pattern excluding certain portions of the first circuit layer which are required to be electrically connected to another circuit layer to be subsequently formed on the first circuit layer;
   (c) coating an electrically conductive copper paste receptive to metal plating on the same side of the base board in a manner as to electrically connect said portions of the first circuit layer, except on certain regions of said portions of the first circuit layer which are to be subsequently processed with a metal plating;
   (d) heating the base board to harden the conductive copper paste;
   (e) cleansing the coated base board; and
   (f) immersing the base board in a metal plating solution to form a metal plating on the electrically conductive copper paste and on said regions of said portions of the first circuit layer, to thereby form a second electrically conductive circuit layer on the first circuit layer.

2. A method as defined in claim 1, wherein the base board is made of a polymer.

3. A method as defined in claim 1, wherein the metal plating is a chemical plating using copper.

4. A method for forming electrically conductive circuits on a base board comprising the steps of:
   (a) attaching a copper layer on one side of the base board;
   (b) etching the copper layer to form a first electrically conductive circuit layer;
   (c) coating a plating-resistant resist on the same side of the base board except on certain portions of the first circuit layer which are required to be electrically connected to another circuit layer to be subsequently formed on the first circuit layer;
   (d) coating an electrically conductive copper paste receptive to metal plating on the same side of the base board in a manner as to electrically connect said portions of the first circuit layer, except on certain regions of said portions of the first circuit layer which are to be subsequently processed with a metal plating;
   (e) heating the base board to harden the conductive copper paste;
   (f) cleansing the coated base board; and
   (g) immersing the base board in a metal plating solution to form a metal plating on the electrically conductive copper paste and on said regions of the first circuit layer, to thereby form a second electrically conductive circuit layer on the first circuit layer, thus providing at least two layers of circuits electrically connected to each other on one side of the base board.

5. A method as defined in claim 4, wherein the metal plating is a chemical plating using copper.

6. A method for forming electrically conductive circuits on a base board comprising the steps of:
   (a) coating an electrically conductive copper paste receptive to metal plating on one side of the base board;
   (b) heating the base board to harden the paste;
   (c) cleansing the base board;
   (d) immersing the base board in a metal plating solution to form a metal plating on the electrically conductive copper paste, to thereby form a first electrically conductive circuit layer;
   (e) coating a plating-resistant resist on the same side of the base board except on certain portions of the first circuit layer which are required to be electrically connected to another circuit layer to be subsequently formed on the first circuit layer;
   (f) coating said electrically conductive copper paste on the same side of the base board in a manner as to electrically connect said portions of the first circuit layer, except on certain regions of said portions of the first circuit layer which are to be subsequently processed with a metal plating;
   (g) heating the base board to harden the paste;
   (h) cleansing the base board; and (i) immersing the base board in a metal plating solution to form a metal plating on the electrically conductive copper paste and on said regions of the first circuit layer, to thereby form a second electrically conductive circuit layer on the first circuit layer, thus providing at least two layers of circuits electrically connected to each other on one side of the base board.

7. A method as defined in claim 6, wherein the metal plating is a chemical plating using copper.

* * * * *